United States Patent
Takikawa et al.

(10) Patent No.: US 7,486,556 B2
(45) Date of Patent: Feb. 3, 2009

(54) SEMICONDUCTOR MEMORY

(75) Inventors: Yutaka Takikawa, Hyogo (JP); Koichi Kawauchi, Hyogo (JP); Satoko Kamakura, Hyogo (JP); Kazuo Nomura, Hyogo (JP); Kazuyuki Kawamoto, Hyogo (JP); Nobutaka Imanishi, Hyogo (JP)

(73) Assignee: Renesas Technology Corp., Chiyoda-Ku, Tokyo (JP)

( * ) Notice: Subject to any disclaimer, the term of this patent is extended or adjusted under 35 U.S.C. 154(b) by 0 days.

(21) Appl. No.: 11/882,878

(22) Filed: Aug. 6, 2007

(65) Prior Publication Data
US 2008/0175051 A1 Jul. 24, 2008

Related U.S. Application Data

(62) Division of application No. 11/098,533, filed on Apr. 5, 2005, now Pat. No. 7,307,889.

(30) Foreign Application Priority Data
Apr. 8, 2004 (JP) .............................. 2004-113752

(51) Int. Cl.
*G11C 11/34* (2006.01)
*G11C 16/04* (2006.01)
*G11C 5/06* (2006.01)
*H01L 29/94* (2006.01)

(52) U.S. Cl. .......................... 365/185.05; 365/185.18; 365/72; 257/314; 257/315

(58) Field of Classification Search ............ 365/185.05, 365/185.18, 72
See application file for complete search history.

(56) References Cited

U.S. PATENT DOCUMENTS

| 5,502,669 | A | * | 3/1996 | Saitoh ................... 365/185.27 |
| 6,323,088 | B1 | | 11/2001 | Gonzalez et al. |
| 6,493,269 | B1 | | 12/2002 | Cernea |
| 6,531,735 | B1 | | 3/2003 | Kamigaki et al. |
| 6,636,440 | B2 | | 10/2003 | Maayan et al. |
| 6,885,044 | B2 | | 4/2005 | Ding |
| 2001/0023954 | A1 | | 9/2001 | Lee et al. |
| 2004/0227245 | A1 | | 11/2004 | Ding |
| 2005/0029577 | A1 | * | 2/2005 | Nishizaka et al. ........... 257/315 |
| 2005/0111279 | A1 | * | 5/2005 | Ogura et al. ................ 365/222 |
| 2005/0135152 | A1 | | 6/2005 | Lee et al. |

FOREIGN PATENT DOCUMENTS

| JP | 5-326886 | 12/1993 |
| JP | 2001-156275 | 6/2001 |
| JP | 2002-329398 | 11/2002 |

* cited by examiner

*Primary Examiner*—Ly D Pham
(74) *Attorney, Agent, or Firm*—Buchanan Ingersoll & Rooney PC

(57) ABSTRACT

A semiconductor memory is achieved which allows a reduction in the area of a memory array block without reducing the gate widths of floating gates. A plurality of select gates extend in straight lines in the X direction. Between the upper- and lower-side select gates, two rows' worth of floating gates are arranged. The plurality of floating gates are placed in a staggered arrangement (in other words, in a zigzag pattern). That is, looking at one floating gate in a specific column and another floating gate in a column adjacent to that specific column, those floating gates deviate from each other in the Y direction.

1 Claim, 19 Drawing Sheets

SEMICONDUCTOR MEMORY

CROSS REFERENCE TO RELATED APPLICATION

This application is a divisional application of application Ser. No. 11/098,533, filed Apr. 5, 2005 now U.S. Pat. No. 7,307,889.

BACKGROUND OF THE INVENTION

1. Field of the Invention

The present invention relates to semiconductor memories, and especially those including select gates and floating gates.

2. Description of the Background Art

Semiconductor memories include a memory array block in which a plurality of memory cells are arranged in a matrix of rows and columns.

Regarding the top surface layout of a memory array block, conventional semiconductor memories include a select gate extending in the row direction and a plurality of floating gates spaced from each other and parallel to the select gate. That is, in conventional semiconductor memories, a plurality of floating gates are spaced from each other in a straight line.

The structures of and control techniques for those semiconductor memories are disclosed, for example, in the following patent documents: Japanese Patent Application Laid-open Nos. 5-326886 (1993), 2002-329398, and 2001-156275.

However, in the above conventional semiconductor memories, since the plurality of floating gates are placed side by side in a straight line, a space of more than the design rule must be left between each two adjacent floating gates, which results in the problem of increased area of the memory array block.

Further, if the gate widths of the floating gates are reduced in order to reduce the area of the memory array block, the amount of current outputted from memory cells in data read operations is reduced. This results in another problem of difficulty of judgment by a sense amplifier.

SUMMARY OF THE INVENTION

An object of the present invention is to achieve a semiconductor memory which allows a reduction in the area of a memory array block without reducing the gate widths of floating gates.

According to a first aspect of the present invention, the semiconductor memory includes a select gate extending in a first direction and a plurality of floating gates coupled with the select gate. The plurality of floating gates include first and second floating gates. The second floating gate is arranged adjacent to the first floating gate and deviating from the first floating gate in a second direction perpendicular to the first direction.

Thus, it is possible to reduce the area of the memory array block without reducing the gate widths of the plurality of floating gates.

According to a second aspect of the present invention, the semiconductor memory includes a select gate formed in a meandering pattern and a plurality of floating gates coupled with the select gate. The plurality of floating gates include first and second floating gates. The first floating gate is arranged to have its gate width defined along a first direction. The second floating gate is arranged to be adjacent to the first floating gate and to have its gate width defined along a second direction perpendicular to the first direction.

Thus, it is possible to reduce the area of the memory array block without reducing the gate widths of the plurality of floating gates.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
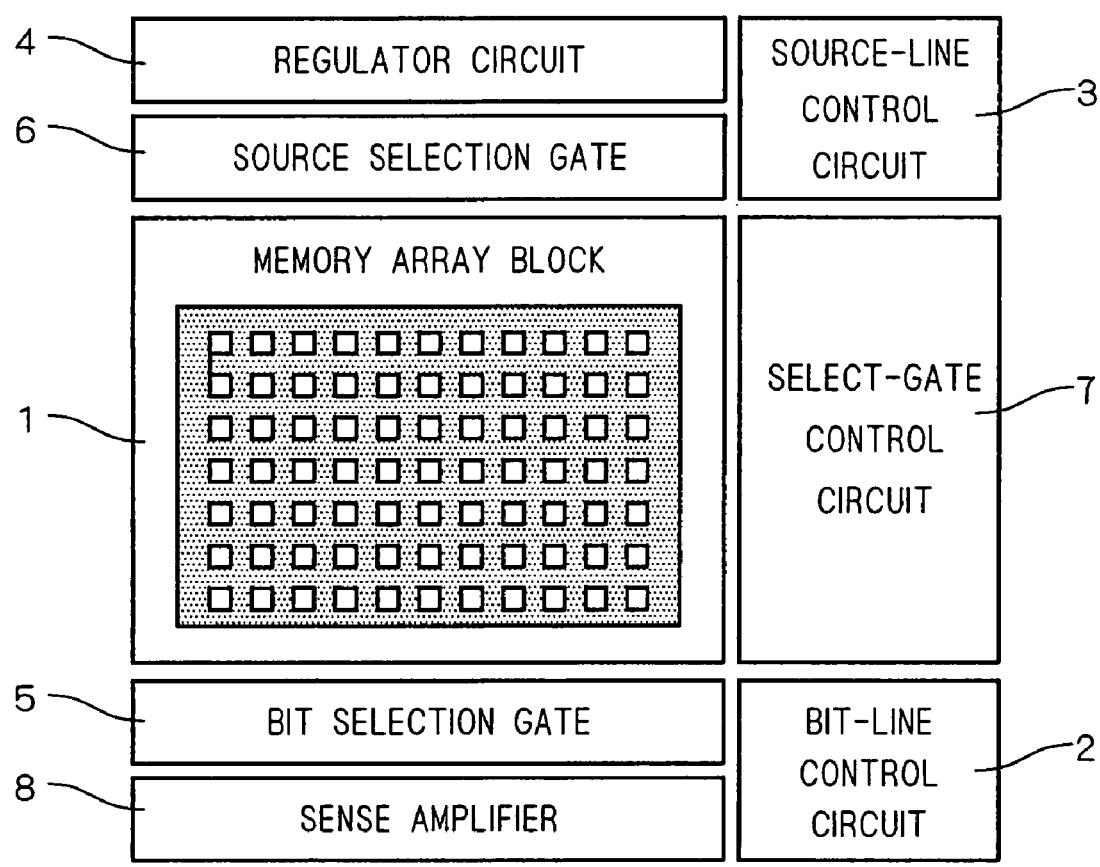
FIG. 1 is a block diagram showing the structure of a memory module according to a first preferred embodiment of the present invention.

FIG. 1 is a block diagram showing the structure of an OTP (one-time programmable) memory module (semiconductor memory) according to a first preferred embodiment of the present invention. As shown in FIG. 1, the memory module according to this first preferred embodiment includes a memory array block 1, a bit-line control circuit 2, a source-line control circuit 3, a regulator circuit 4, a bit selection gate 5, a source selection gate 6, a select-gate control circuit 7, and a sense amplifier 8.

The memory array block 1 has a plurality of memory cells arranged in a matrix of rows and columns. More specifically, the memory array block 1 includes a plurality of bit lines extending in the column direction, a plurality of source lines extending in the column direction, a plurality of memory transistors each having a floating gate, and a plurality of select transistors each having a select gate. In each memory cell, a memory transistor and a select transistor are connected in series with each other.

The bit-line control circuit 2 outputs a bit-line selection signal for selecting a bit line which corresponds to a memory cell to be accessed, on the basis of an input signal from the outside of the memory module. The source-line control circuit 3 outputs a source-line selection signal for selecting a source line which corresponds to a memory cell to be accessed, on the basis of an input signal from the outside of the memory module. If all the columns of the memory array use a common source line, the source-line control circuit 3 can be omitted.

The regulator circuit 4, in each case of data reading and writing from and to a memory cell, determines a voltage value to be supplied to the memory cell and outputs that voltage. The source selection gate 6 includes a plurality of transistors and turns on required transistors according to the source-line selection signal inputted from the source-line control circuit 3 to select a source line corresponding to a memory cell to be accessed. Thereby, the voltage outputted from the regulator circuit 4 is supplied through the source line selected by the source selection gate 6 to the memory cell to be accessed.

The sense amplifier 8, in data reading, detects a voltage outputted from the accessed memory cell to determine whether data stored in that memory cell is "0" or "1". The bit selection gate 5 includes a plurality of transistors and turns on required transistors according to the bit-line selection signal inputted from the bit-line control circuit 2 to select a bit line corresponding to a memory cell to be accessed. For example in data reading, the voltage outputted from the accessed memory cell is transmitted through a bit line selected by the bit selection gate 5 to the sense amplifier 8.

The select-gate control circuit 7, in order to turn on the select transistor in a memory cell to be accessed, applies a gate voltage to a select gate corresponding to that memory cell.

Figure 2:
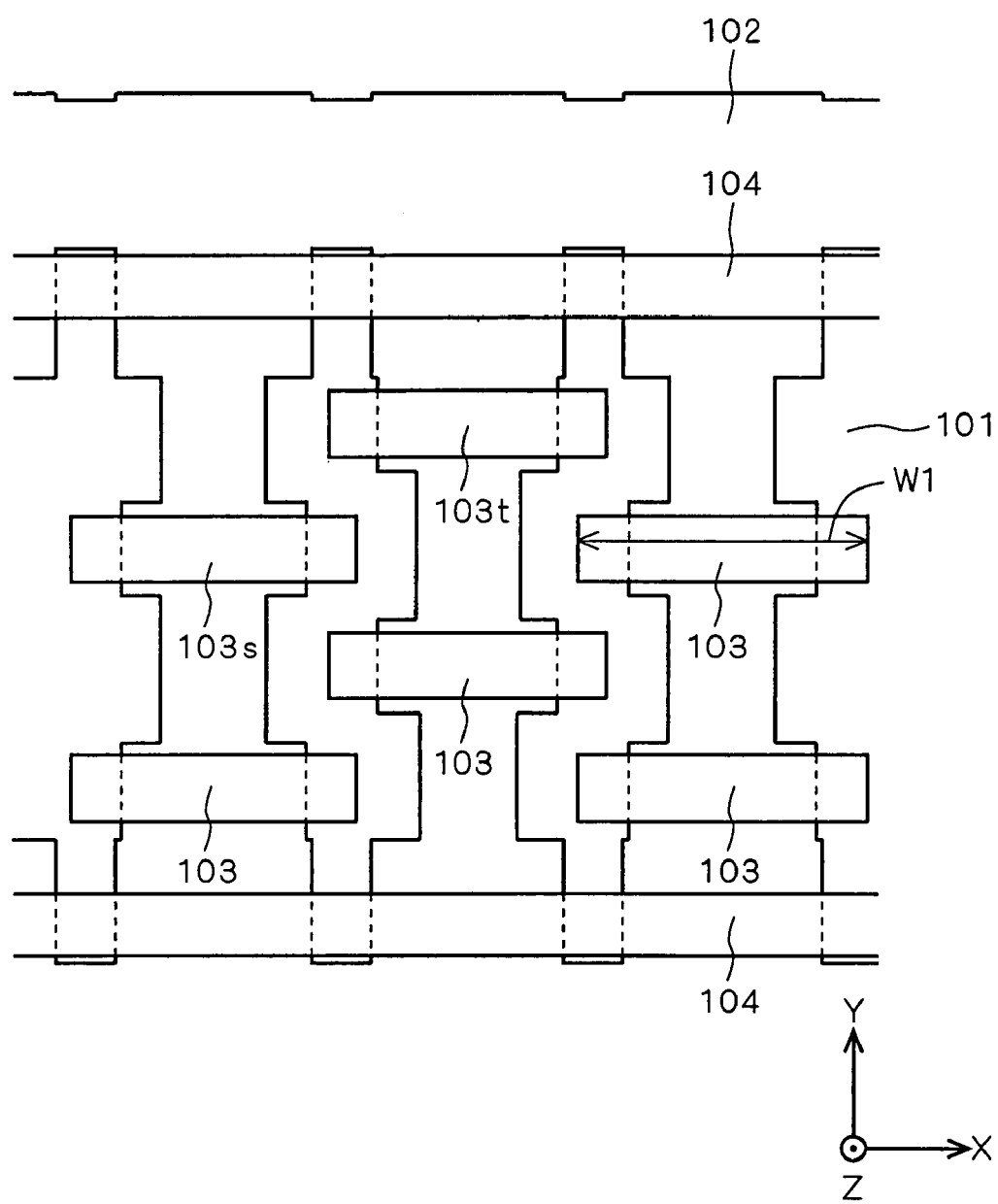
FIGS. 2 and 3 are top views showing, in partial cutaway, a layout pattern of a memory array block according to the first preferred embodiment of the present invention.
Figure 3:
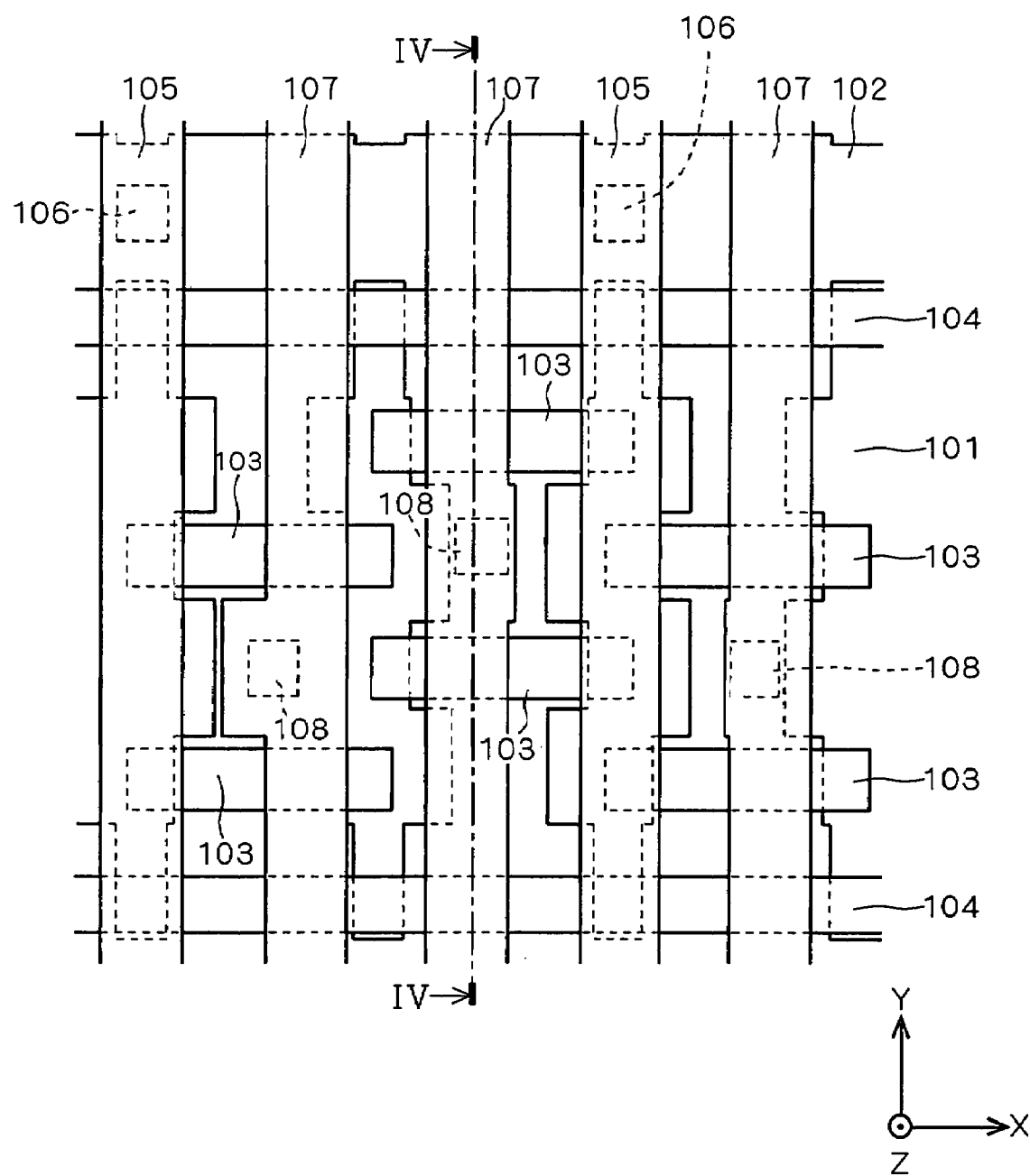

FIGS. 2 and 3 are top views showing, in partial cutaway, a layout pattern of the memory array block 1 according to the first preferred embodiment of the present invention. To clearly show the arrangement pattern of the floating gates 103, FIG. 2 omits metal interconnect lines 105 and 107 shown in the structure of FIG. 3. In FIGS. 2 and 3, the X direction corresponds to the row direction; the Y direction perpendicular to the X direction corresponds to the column direction; and the Z direction perpendicular to both the X and Y directions corresponds to the height direction. The same applies to the following drawings.

Referring to FIG. 2, an isolation insulating film 101 and an impurity diffusion region 102 are formed in the upper surface of a silicon substrate 110 (see FIG. 4; described below). The isolation insulating film 101 is made of, for example, silicon dioxide. Further, a plurality of select gates 104 extend in lines in the X direction. FIG. 2 shows two select gates 104. Between the upper- and lower-side select gates 104, two rows' worth of the floating gates 103 (including 103s and 103t) are located. FIG. 2 shows six floating gates 103, out of which the upper three floating gates 103 are coupled with the upper-side select gate 104, and the lower three floating gates 103 are coupled with the lower-side select gate 104.

As shown in FIG. 2, the plurality of floating gates 103 are placed in a staggered arrangement (in other words, in a zigzag pattern). More specifically, looking at one floating gate 103 (e.g., 103s) in a specific column and another floating gate 103 (e.g., 103t) in a column adjacent to that specific column, those floating gates 103s and 103t deviate from each other in the Y direction. The right end of the floating gate 103s and the left end of the floating gate 103t overlap each other in the X direction.

Referring to FIG. 3, the plurality of metal interconnect lines 107 serving as bit lines are arranged in columns. The metal interconnect lines 107 are made of, for example, aluminum. The metal interconnect lines 107 extend in the Y direction and are in contact with the upper surface of the impurity diffusion region 102 through contact holes 108 between the upper and lower floating gates 103.

Further, the metal interconnect lines 105 of, for example, aluminum extend in the Y direction. The metal interconnect lines 105 are in contact with the upper surface of the impurity diffusion region 102 through contact holes 106. They serve as source lines.

Figure 4:
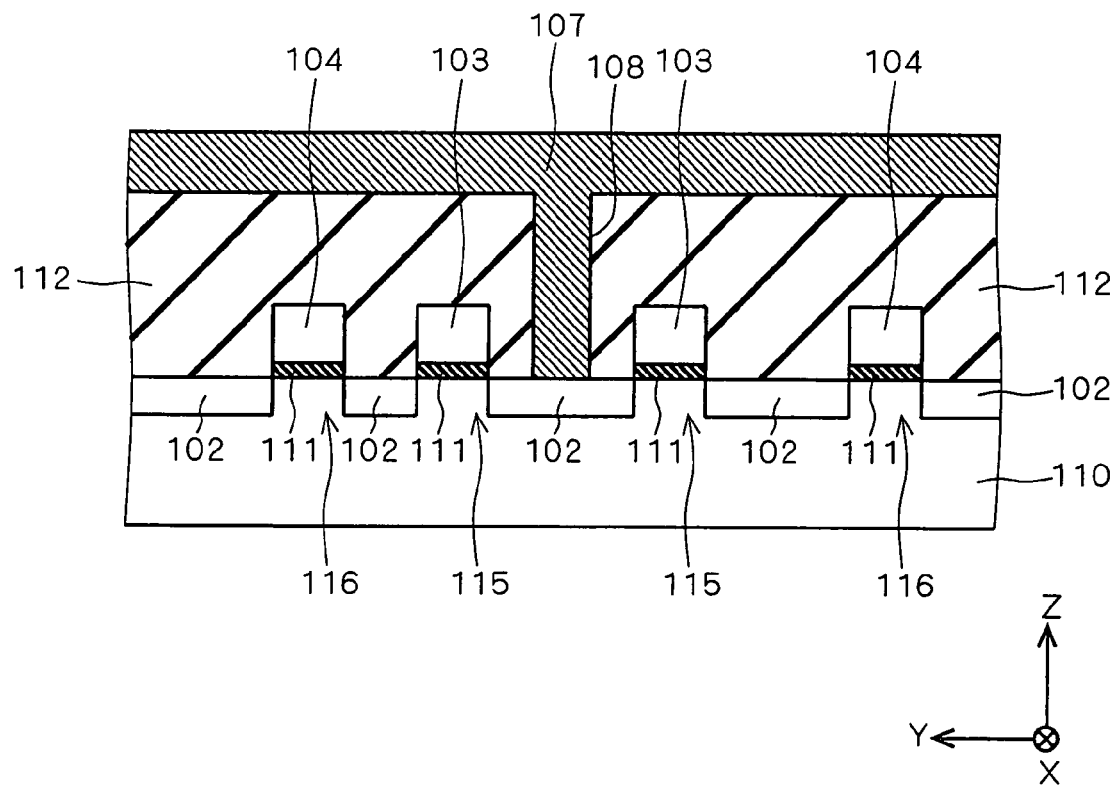
FIG. 4 is a cross-sectional view showing a sectional structure taken along line IV-IV of FIG. 3.

FIG. 4 is a cross-sectional view showing a sectional structure taken along line IV-IV of FIG. 3. In the upper surface of the silicon substrate 110, the impurity diffusion region 102 is partially formed. The conductivity type of the impurity diffusion region 102 is, for example, P-type. On the upper surface of the silicon substrate 110, a gate insulating film 111 is partially formed. The gate insulating film 111 is made of, for example, silicon dioxide. On the gate insulating film 111, the floating gates 103 or the select gates 104 are formed. The floating gates 103 and the select gates 104 are made of, for example, polysilicon. The floating gates 103 serve as the gate electrodes of the memory transistors 115, and the select gates 104 as the gate electrodes of the select transistors 116. The impurity diffusion region 102 serves as the source/drain region of each of the memory transistors 115 and the select transistors 116.

An interlayer insulating film 112 is formed to cover the memory transistors 115 and the select transistors 116. The interlayer insulating film 112 is made of, for example, silicon dioxide. On the upper surface of the interlayer insulating film 112, the metal interconnect lines 107 are formed. In the interlayer insulating film 112, the contact holes 108 are partially formed to penetrate the interlayer insulating film 112 from the upper to the bottom surfaces. Through the contact holes 108, the metal interconnect lines 107 are in contact with the upper surface of the impurity diffusion region 102 between each two floating gates 103.

Figure 5:
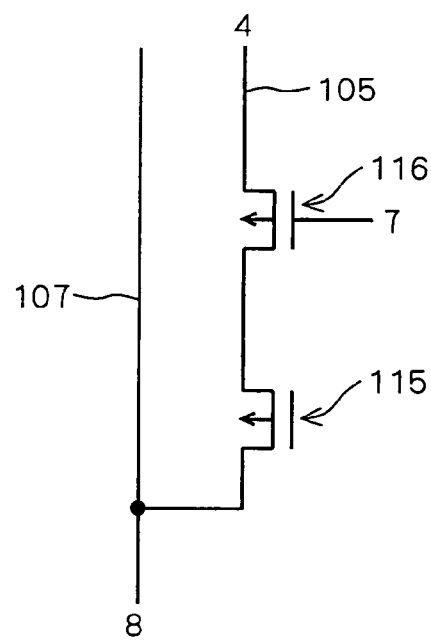
FIG. 5 is a circuit diagram showing the equivalent circuit of a memory cell.

FIG. 5 is a circuit diagram showing the equivalent circuit of one memory cell. The source of the select transistor 116 is connected through the metal interconnect line 105 to the regulator circuit 4 (or the source selection gate 6) shown in FIG. 1. The gate electrode (select gate 104) of the select transistor 116 is connected to the select-gate control circuit 7 shown in FIG. 1. The drain of the select transistor 116 is connected to the source of the memory transistor 115. The gate electrode (floating gate 103) of the memory transistor 115 is connected to nowhere. The drain of the memory transistor 115 is connected through the metal interconnect line 107 to the sense amplifier 8 (or the bit selection gate 5) shown in FIG. 1.

As shown in FIG. 2, the memory module according to the first preferred embodiment has the plurality of floating gates 103 in a staggered arrangement. Thus, it can reduce the area of the memory array block 1 without reducing the gate widths of the floating gates 103, as compared to a conventional memory module shown in FIG. 6.

Figure 6:
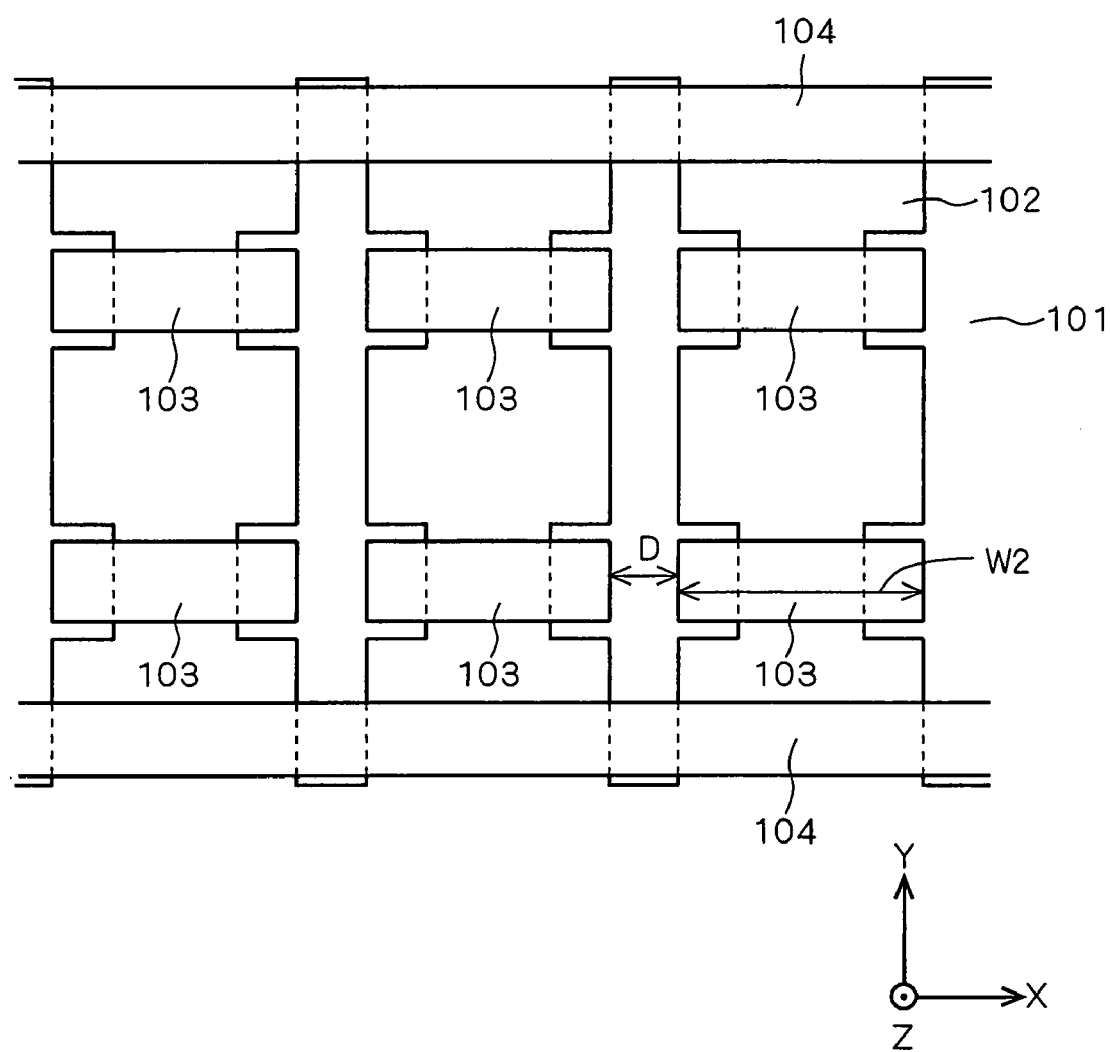
FIG. 6 is a top view showing, in partial cutaway, a layout pattern of a conventional memory array block.

More specifically, in the conventional memory module shown in FIG. 6, a plurality of floating gates 103 belonging to one row are placed side by side in a straight line. Thus, a space of more than a design rule D must be left between each two adjacent floating gates 103, which results in the increased area of the memory array block 1. On the other hand, in the memory module according to this first preferred embodiment shown in FIG. 2, the plurality of floating gates 103 are arranged in staggered lines. Thus, it is possible to lessen the space between each two adjacent floating gates while maintaining the gate width W1 (cf. FIG. 2) of the floating gates 103 at almost the same value as the gate width W2 (cf. FIG. 6) of the floating gates 103 in the conventional memory module. As a result, the area of the memory array block 1 can be reduced. Alternatively, instead of lessening the space between each two adjacent floating gates, the gate width W1 of the floating gates 103 may be increased, in which case the effect of increased current flowing from the memory cell is achieved.

Second Preferred Embodiment

This second preferred embodiment provides a memory module which uses interchangeable source and bit lines.

Figure 7:
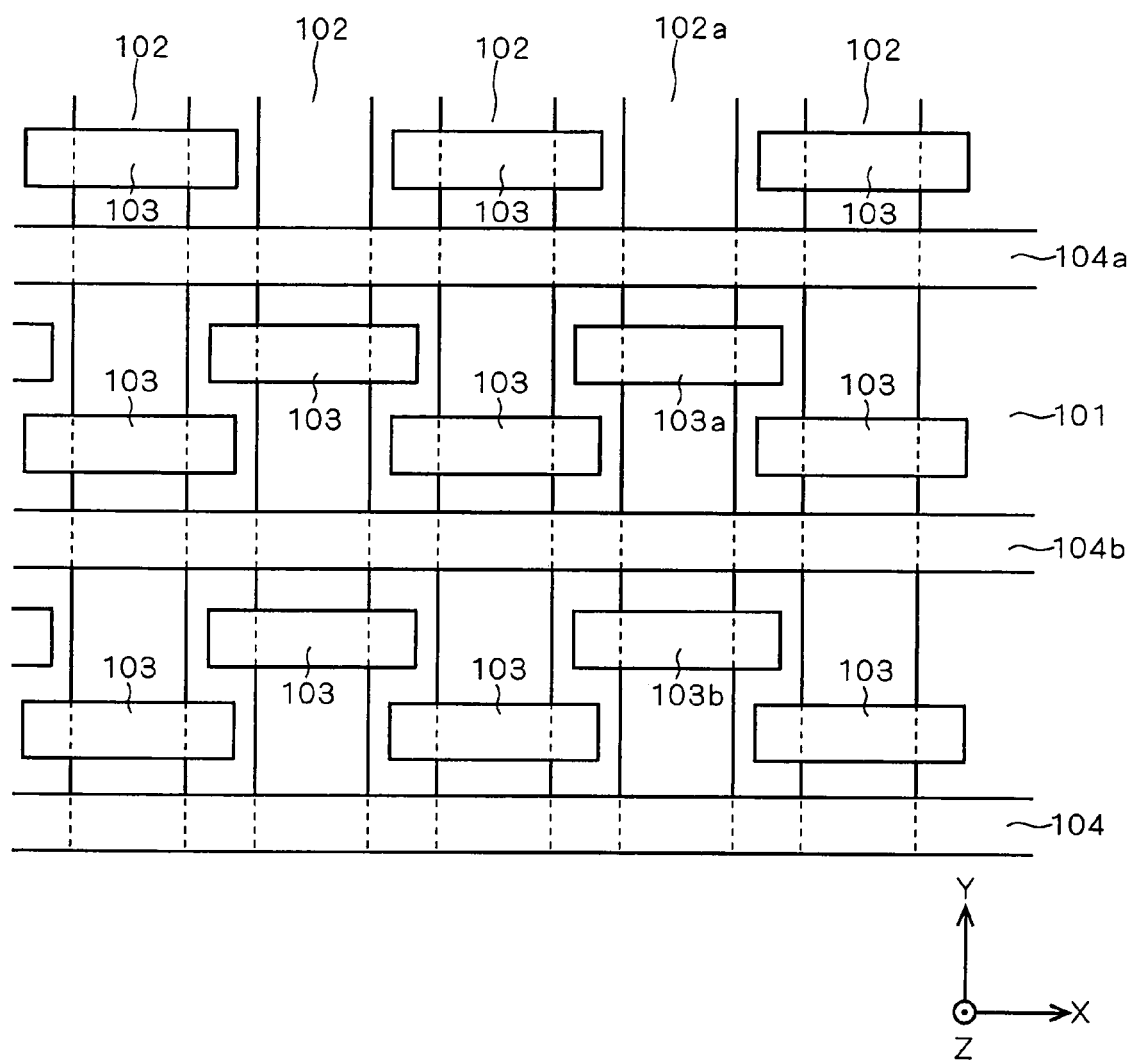
FIGS. 7 to 9 are top views showing, in partial cutaway, a layout pattern of a memory array block according to a second preferred embodiment of the present invention.
Figure 8:
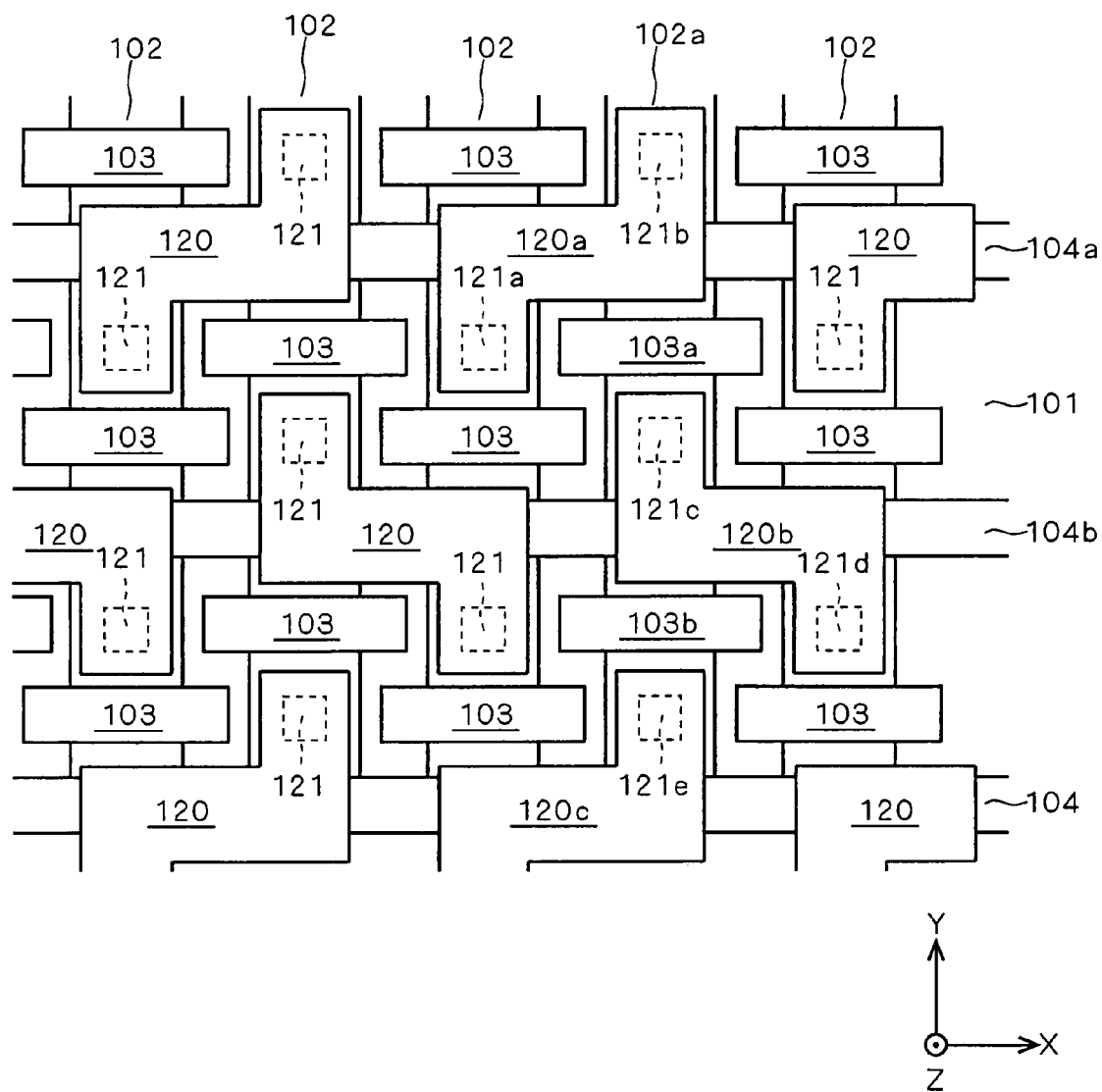
Figure 9:
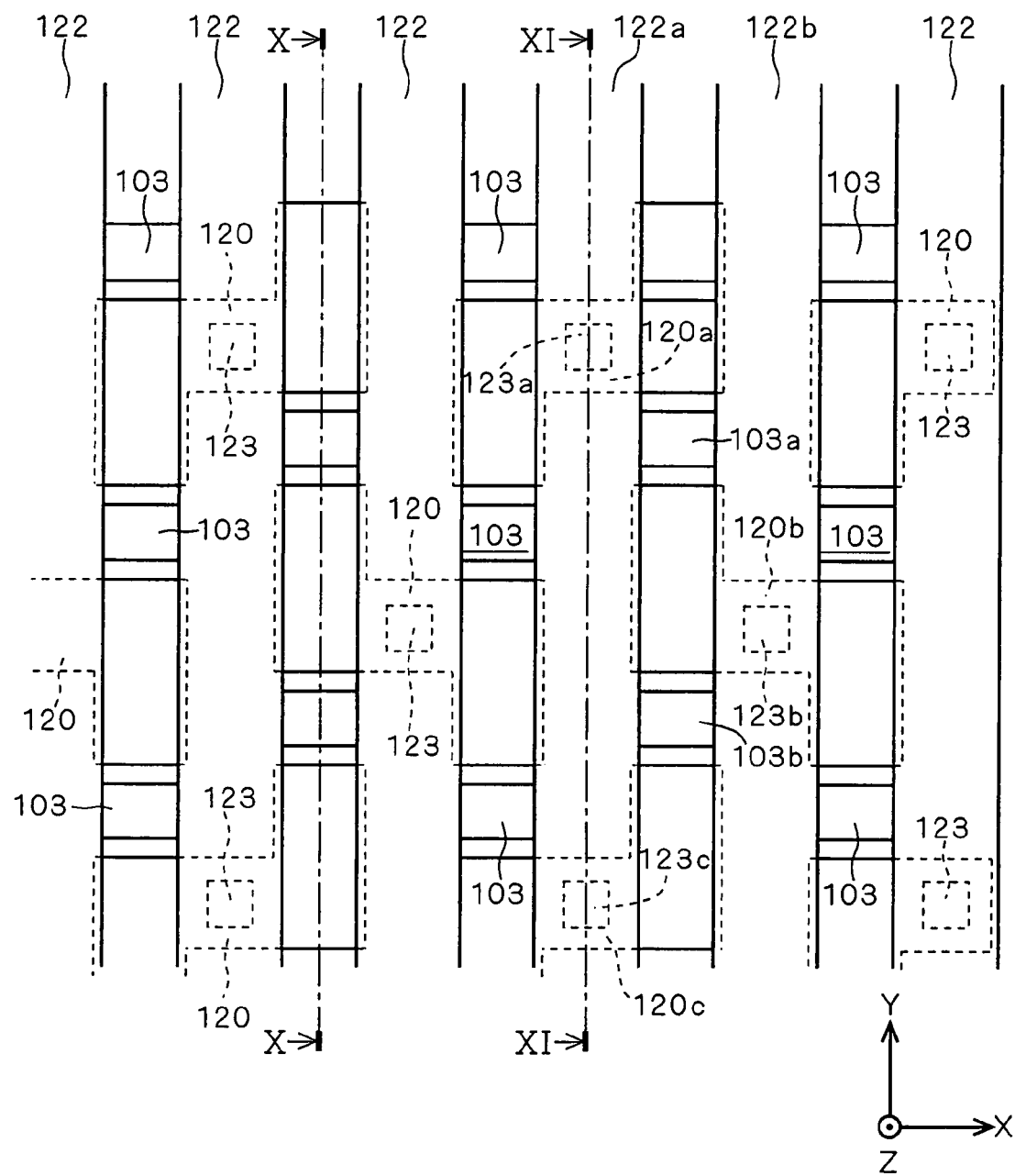

FIGS. 7 to 9 are top views showing, in partial cutaway, a layout pattern of the memory array block 1 according to the second preferred embodiment of the present invention. To clearly show the arrangement pattern of metal interconnect lines 120, FIG. 8 omits metal interconnect lines 122 shown in the structure of FIG. 9. Further to clearly show the arrangement pattern of the floating gates 103, FIG. 7 omits the metal interconnect lines 120 shown in the structure of FIG. 8. A block diagram showing the entire structure of the memory module is identical to that of FIG. 1.

Referring to FIG. 7, in the upper surface of the silicon substrate 110, the isolation insulating film 101 and the impurity diffusion region 102 (including 102a) are formed. The plurality of select gates 104 (including 104a and 104b) extend in lines in the X direction. Between each two adjacent select gates 104, one row's worth (two lines) of floating gates 103 (including 103a and 103b) are located. As shown in FIG. 7, the plurality of floating gates 103 are placed in a staggered arrangement.

Referring to FIG. 8, the plurality of metal interconnect lines 120 (including 120a, 120b, and 120c) are arranged as first-layer interconnection. The metal interconnect lines 120 are made of, for example, aluminum. The metal interconnect lines 120 are in contact with the impurity diffusion region 102 through contact holes 121 (including 121a, 121b, 121c, 121d, and 121e). For example, the metal interconnect line 120a is in contact with the impurity diffusion region 102a through the contact hole 121b and in contact with the impurity diffusion region 102 through the contact hole 121a. The metal interconnect line 120b is in contact with the impurity diffusion region 102a through the contact hole 121c and in contact with the impurity diffusion region 102 through the contact hole 121d.

Referring to FIG. 9, the plurality of metal interconnect lines 122 (including 122a and 122b) serving as source or bit lines are arranged in columns as second-layer interconnection. As an alternative, those metal interconnect lines 122 may be divided between two interconnect layers and alternately arranged with even-numbered ones as second-layer interconnection and odd-numbered ones as third-layer interconnection. This prevents interference of current between each adjacent memory cells and avoids misjudgment by the sense amplifier 8 without application of the feature of the present invention described in the subsequent third preferred embodiment.

The metal interconnect lines 122 are made of, for example, aluminum. The metal interconnect lines 122 extend in the Y direction and are in contact with the metal interconnect lines 120 through via holes 123 (including 123a, 123b, and 123c). For example, the metal interconnect line 122a is in contact with the metal interconnect line 120a through the via hole 123a and in contact with the metal interconnect line 120c through the via hole 123c. The metal interconnect line 122b is in contact with the metal interconnect line 120b through the via hole 123b.

Figure 10:
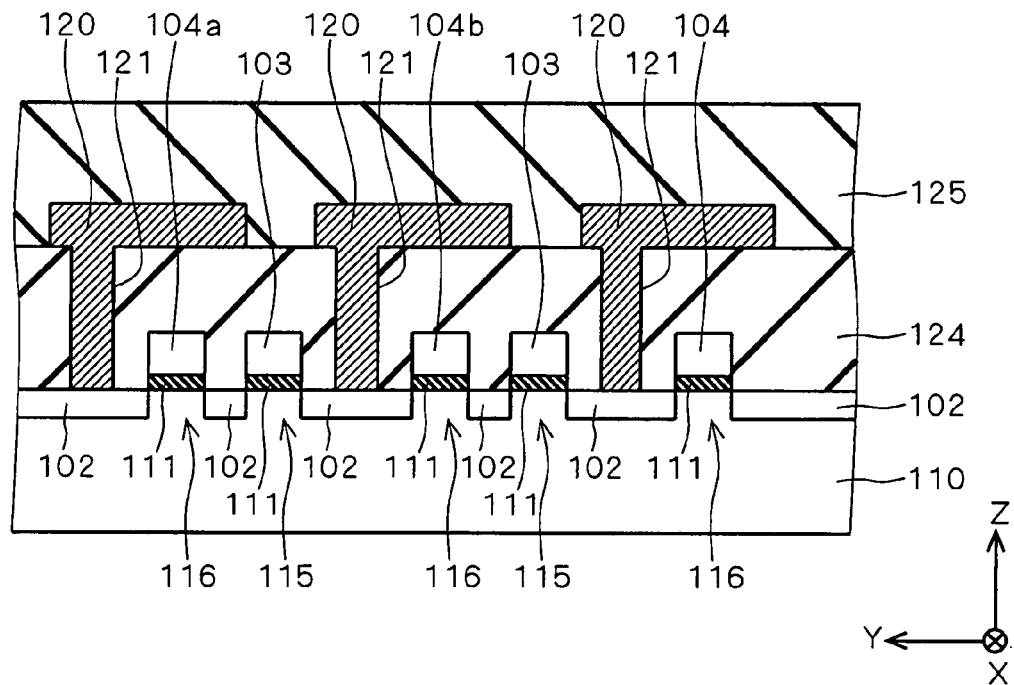
FIG. 10 is a cross-sectional view showing a sectional structure taken along line X-X of FIG. 9.

FIG. 10 is a cross-sectional view showing a sectional structure taken along line X-X of FIG. 9. In the upper surface of the silicon substrate 110, the impurity diffusion region 102 is partially formed. On the upper surface of the silicon substrate 110, the gate insulating film 111 is partially formed, on which the floating gates 103 or the select gates 104 are formed. Then, an interlayer insulating film 124 is formed to cover the memory transistors 115 and the select transistors 116. The interlayer insulating film 124 is made of, for example, silicon dioxide. On the upper surface of the interlayer insulating film 124, the metal interconnect lines 120 are formed. In the interlayer insulating film 124, the contact holes 121 are partially formed to penetrate the interlayer insulating film 124 from the upper to the bottom surfaces. Through the contact holes 121, the metal interconnect lines 120 are in contact with the upper surface of the impurity diffusion region 102. On the upper surface of the interlayer insulating film 124, an interlayer insulating film 125 is formed to cover the metal interconnect lines 120. The interlayer insulating film 125 is made of, for example, silicon dioxide.

Figure 11:
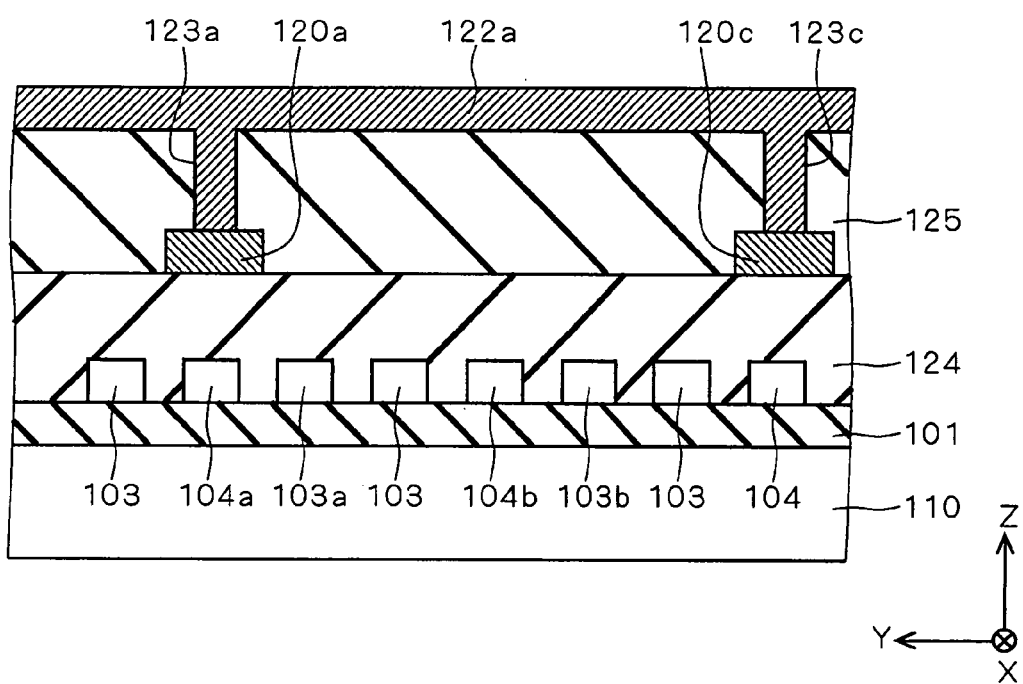
FIG. 11 is a cross-sectional view showing a sectional structure taken along line XI-XI of FIG. 9.

FIG. 11 is a cross-sectional view showing a sectional structure taken along line XI-XI of FIG. 9. In the upper surface of the silicon substrate 110, the isolation insulating film 101 is formed. On the upper surface of the isolation insulating film 101, the floating gates 103 and the select gates 104 are formed. Also on the upper surface of the isolation insulating film 101, the interlayer insulating film 124 is formed to cover the floating gates 103 and the select gates 104. On the upper surface of the interlayer insulating film 124, the metal interconnect lines 120 are formed. Also on the upper surface of the interlayer insulating film 124, the interlayer insulating film 125 is formed to cover the metal interconnect lines 120. On the upper surface of the interlayer insulating film 125, the metal interconnect lines 122 are formed. In the interlayer insulating film 125, the via holes 123 are partially formed to penetrate the interlayer insulating film 125 from the upper to the bottom surfaces. Through the via holes 123, the metal interconnect lines 122 are in contact with the upper surfaces of the metal interconnect lines 120.

Figure 12:
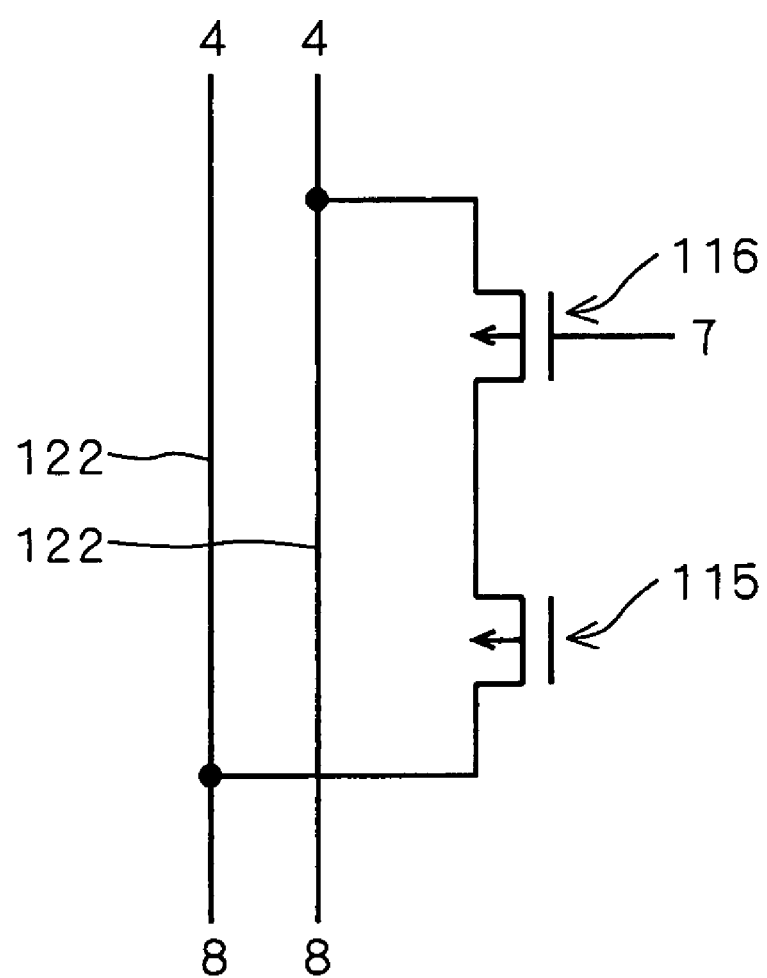
FIG. 12 is a circuit diagram showing the equivalent circuit of a memory cell.

FIG. 12 is a circuit diagram showing the equivalent circuit of one memory cell. The source of the select transistor 116 is connected through the metal interconnect line 122 in a specific column to the regulator circuit 4 (or the source selection gate 6) shown in FIG. 1. The gate electrode (select gate 104) of the select transistor 116 is connected to the select-gate control circuit 7 shown in FIG. 1. The drain of the select transistor 116 is connected to the source of the memory transistor 115. The gate electrode (floating gate 103) of the memory transistor 115 is connected to nowhere. The drain of the memory transistor 115 is connected through the metal interconnect line 122 in a column adjacent to the above specific column to the sense amplifier 8 (or the bit selection gate 5) shown in FIG. 1.

Referring to FIGS. 8 and 9, for example when a memory cell including the floating gate 103a and the select gate 104a is being accessed, the metal interconnect line 122a serves as a source line, and the metal interconnect line 122b as a bit line. More specifically, a source potential is supplied from the metal interconnect line 122a through the via hole 123a, the metal interconnect line 120a, and the contact hole 121b in this order to the impurity diffusion region 102a (the source of the select transistor 116). The output voltage of the memory cell is transmitted from the impurity diffusion region 102a (the drain of the memory transistor 115) through the contact hole 121c, the metal interconnect line 120b, and the via hole 123b in this order to the metal interconnect line 122b.

Conversely, when a memory cell including the floating gate 103b and the select gate 104b is being accessed, the metal interconnect line 122b serves as a source line, and the metal interconnect line 122a as a bit line. More specifically, a source potential is supplied from the metal interconnect line 122b through the via hole 123b, the metal interconnect line 120b, and the contact hole 121c in this order to the impurity diffusion region 102a (the source of the select transistor 116). The output voltage of the memory cell is transmitted from the impurity diffusion region 102a (the drain of the memory transistor 115) through the contact hole 121e, the metal interconnect line 120c, and the via hole 123c in this order to the metal interconnect line 122a.

In this way, the memory module according to this second preferred embodiment uses interchangeable source and bit lines which can be exchanged with each other depending on the memory cell to be accessed.

Hereinbelow, a detailed description is given of the reading of data stored in a memory cell.

Figure 13:
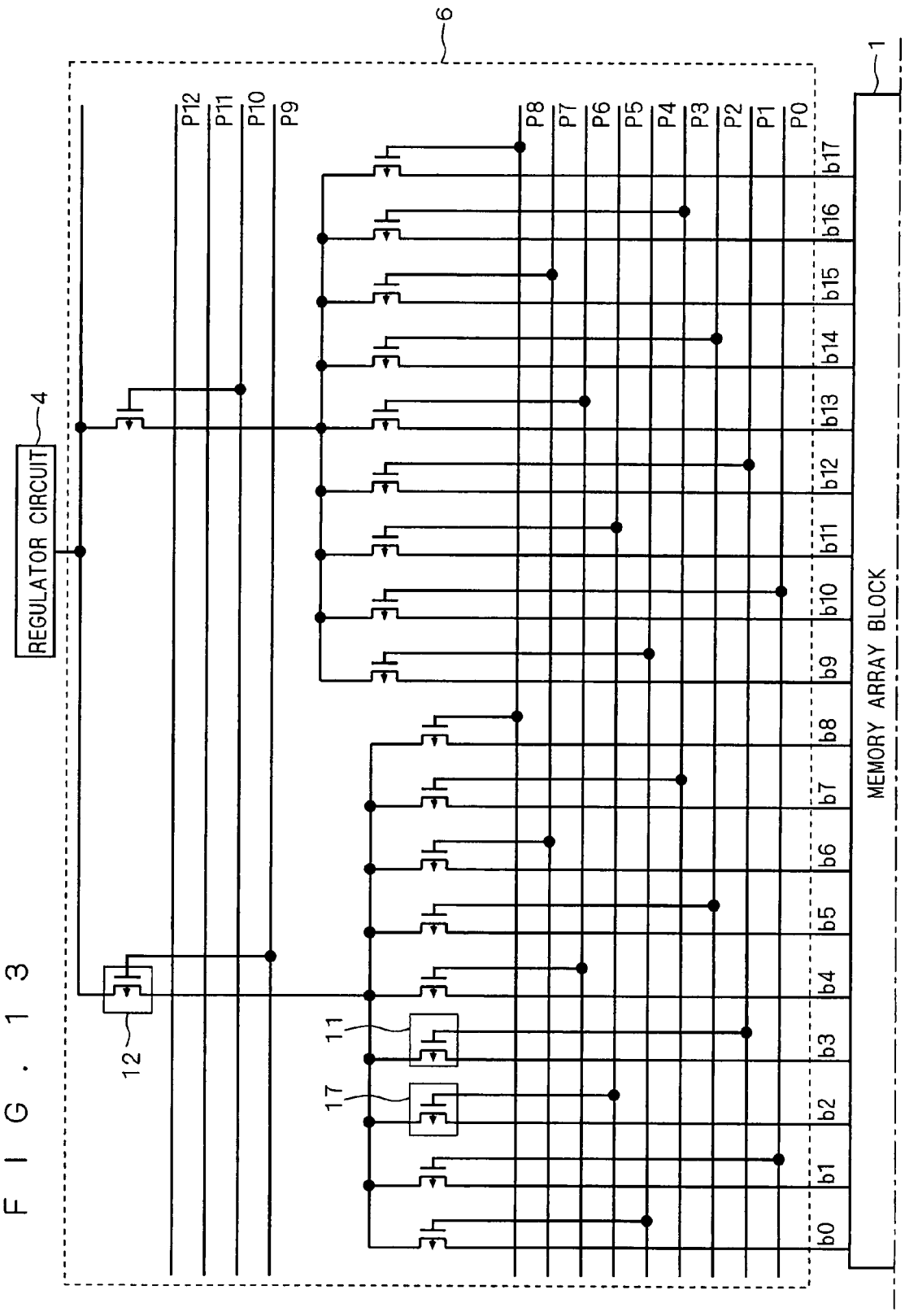
FIG. 13 is a circuit diagram specifically showing the circuit configuration of a source selection gate shown in FIG. 1.
Figure 14:
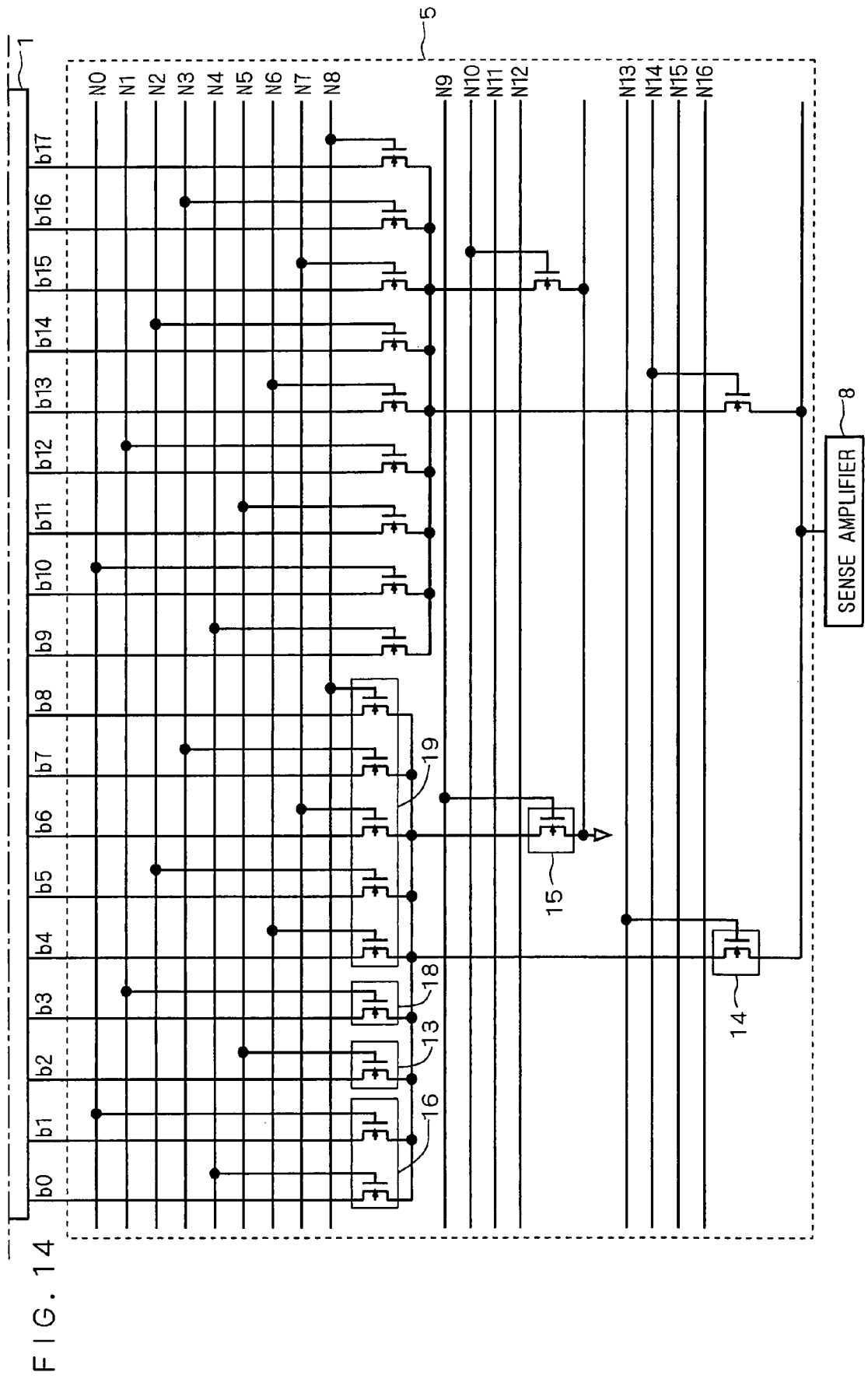
FIG. 14 is a circuit diagram specifically showing the circuit configuration of a bit selection gate shown in FIG. 1.
Figure 15:
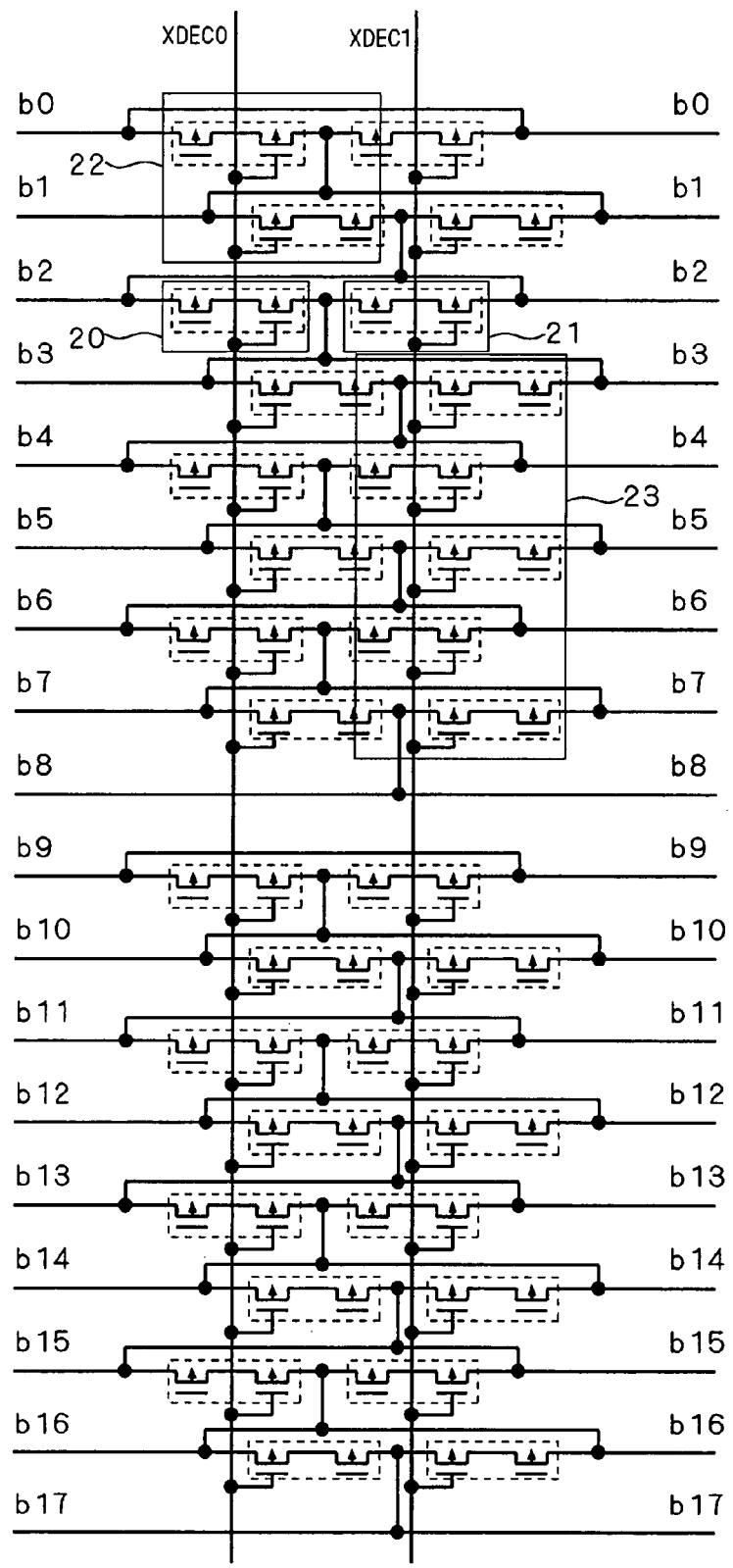
FIG. 15 is a circuit diagram showing part of the circuit configuration of the memory array block shown in FIG. 1.

FIG. 13 is a circuit diagram specifically showing the circuit configuration of the source selection gate 6 shown in FIG. 1. FIG. 14 is a circuit diagram specifically showing the circuit configuration of the bit selection gate 5 shown in FIG. 1. FIGS. 13 and 14 are contiguous to each other along the dash dotted line. FIG. 15 is a circuit diagram showing part of the circuit configuration of the memory array block 1 shown in FIG. 1.

In the example shown in FIG. 13, the source selection gate 6 is divided into two groups each corresponding to eight (8 bits of) memory cells belonging to one row. Similarly, in the example shown in FIG. 14, the bit selection gate 5 is divided into two groups each corresponding to 8 bits of memory cells belonging to one row.

Firstly, the reading of data stored in a memory cell 20 shown in FIG. 15 is described. In this case, a signal line b3 shown in FIG. 15 serves as a source line, and a signal line b2 as a bit line. Thus, the source-line control circuit 3 shown in FIG. 1 applies a "L (Low)" voltage (source-line selection signal) to signal lines P1 and P9 to turn on PMOS transistors 11 and 12 connected to the signal line b3 in FIG. 13. Thereby, the voltage outputted from the regulator circuit 4 is supplied through the PMOS transistors 12 and 11 in this order to the memory cell 20. At this time, the source-line control circuit 3 in FIG. 1 applies a "H (High)" voltage to signal lines P0, P2-P8, and P10-P12, so that all transistors in the source selection gate 6 except the PMOS transistors 11 and 12 are turned off.

Also in the reading of data stored in the memory cell 20, the bit-line control circuit 2 shown in FIG. 1 applies a "H" voltage (bit-line selection signal) to signal lines N5 and N13 to turn on NMOS transistors 13 and 14 connected to the signal line b2 in FIG. 14. Thereby, a current from the memory cell 20 flows through the NMOS transistors 13 and 14 in this order and is detected by the sense amplifier 8. At this time, the bit-line control circuit 2 in FIG. 1 applies a "L" voltage to signal lines N0-N4, N6-N12, and N14-N16, so that all transistors in the bit selection gate 5 except the NMOS transistors 13 and 14 are turned off.

Next described is the reading of data stored in a memory cell 21 shown in FIG. 15. In this case, the signal line b2 shown in FIG. 15 serves as a source line, and the signal line b3 as a bit line. Thus, the source-line control circuit 3 in FIG. 1 applies a "L" voltage to the signal lines P5 and P9 to turn on PMOS transistors 12 and 17 connected to the signal line b2 in FIG. 13. Thereby, the output voltage of the regulator circuit 4 is supplied through the PMOS transistors 12 and 17 in this order to the memory cell 21. At this time, the source-line control circuit 3 in FIG. 1 applies a "H" voltage to the signal lines P0-P4, P6-P8, and P10-P12, so that all the transistors in the source selection gate 6 except the PMOS transistors 12 and 17 are turned off.

Also in the reading of data stored in the memory cell 21, the bit-line control circuit 2 in FIG. 1 applies a "H" voltage to the signal lines N1 and N13 to turn on NMOS transistors 14 and 18 connected to the signal line b3 in FIG. 14. Thereby, a current from the memory cell 21 flows through the NMOS transistors 18 and 14 in this order and is detected by the sense amplifier 8. At this time, the bit-line control circuit 2 in FIG. 1 applies a "L" voltage to the signal lines N0, N2-N12, and N14-N16, so that all the transistors in the bit selection gate 5 except the NMOS transistors 14 and 18 are turned off.

Similarly, in the reading of data stored in memory cells connected to a signal line b7 in FIG. 15, a signal line b8 serves as a source or bit line. Thus, when memory cells are divided into groups of 8 bits, it is necessary to add, for every 8 bits, one PMOS and one NMOS transistors both connected to the signal line b8 to the source selection gate 6 and the bit selection gate 5, respectively. If memory cells are not divided into such groups of 8 bits, such additional PMOS and NMOS transistors are unnecessary.

Hereinbelow, descriptions are given of the select-gate control circuit 7, the source-line control circuit 3, and the bit-line control circuit 2 shown in FIG. 1. In order to turn on the select transistor 116 in a memory cell to be accessed, the select-gate control circuit 7 applies a gate voltage to the select gate 104 corresponding to that memory cell according to address data inputted from the outside of the memory module.

The source-line control circuit 3, according to the address data inputted from the outside of the memory module, generates and outputs the source selection signal for turning on transistors corresponding to a memory cell to be accessed, out of a plurality of PMOS transistors in the source selection gate 6. For this, the source-line control circuit 3 includes a logic circuit for setting a signal as corresponding to /{(A3*A4B) *A5B} when the address of the memory cell 20 shown in FIG. 15 is, for example, "0010" (in hexadecimal). Here, A3 to A5 each represent bit data of the address, with A3 representing address A[3], A4 representing address A[4], and A5 representing address A[5].

Similarly, the bit-line control circuit 2, according to the address data inputted from the outside of the memory module, generates and outputs a bit selection signal for turning on transistors corresponding to a memory cell to be accessed, out of a plurality of NMOS transistors in the bit selection gate 5. For this, the bit-line control circuit 2 includes a logic circuit for setting a signal as corresponding to {(A2*A3B*A4B)+ (A2B*A3*A4B)}*A5B when the address of the memory cell 20 shown in FIG. 15 is, for example, "0010" (in hexadecimal).

Also, in order to transmit only the current flowing from a memory cell to the sense amplifier 8, the source-line control circuit 3 and the bit-line control circuit 2 have the discharge function of drawing charge capacities of all memory cells in the memory array block 1 prior to the start of data reading. During discharge, the source-line control circuit 3 have all the PMOS transistors in the source selection gate 6 turned off, and the bit-line control circuit 2 have all the NMOS transistors in the bit selection gate 5 turned on.

Hereinbelow, the writing of data to a memory cell will be described in detail.

Firstly, data writing to the memory cell 20 shown in FIG. 15 is described. In this case, the signal line b3 shown in FIG. 15 serves as a source line, and the signal line b2 as a bit line. Thus, the source-line control circuit 3 in FIG. 1 applies a "L" voltage to the signal lines P1 and P9 to turn on the PMOS transistors 11 and 12 connected to the signal line b3 in FIG. 13. Thereby, a write voltage outputted from the regulator circuit 4 is supplied through the PMOS transistors 12 and 11 in this order to the memory cell 20 (more specifically, the source of the select transistor 116 in the memory cell 20). At this time, the source-line control circuit 3 in FIG. 1 applies a "H" voltage to the signal lines P0, P2-P8, and P10-P12, so that all the transistors in the source selection gate 6 except the PMOS transistors P11 and 12 are turned off.

Further in the data writing to the memory cell 20, the bit-line control circuit 2 in FIG. 1 applies a "H" voltage to the signal lines N0, N4, N5, and N9 to turn on the NMOS transistors 13, 15, and 16 shown in FIG. 14. Thereby, a current for writing data to the memory cell 20 flows through the NMOS transistors 13 and 15. At this time, the bit-line control circuit 2 in FIG. 1 applies a "L" voltage to the signal lines N1-N3, N6-N8, and N10-N16, so that all the transistors in the bit selection gate 5 except the NMOS transistors 13, 15, and 16 are turned off.

Here, the reason why the NMOS transistors 16 are turned on in the data writing to the memory cell 20 is as follows. Referring to FIG. 15, in the data writing to the memory cell 20, select transistors 116 in memory cells 22 are turned on as well as the select transistor 116 in the memory cell 20. Further, the current from the memory cell 20 flows also to the memory cells 22 through the signal line b2. This results in an increase in the potentials of the memory cells 22 (more specifically the drain potentials of the memory transistors 115 or the select transistors 116 in the memory cells 22). To prevent this, in the data writing to the memory cell 20, the NMOS transistors 16 are turned on to draw charge flowing from the memory cell 20 to the memory cells 22.

Next, data writing to the memory cell 21 shown in FIG. 15 is described. In this case, the signal line b2 shown in FIG. 15 serves as a source line, and the signal line b3 as a bit line. Thus, the source-line control circuit 3 in FIG. 1 applies a "L" voltage to the signal lines P5 and P9 to turn on the PMOS transistors 12 and 17 connected to the signal line b2 in FIG. 13. Thereby, the write voltage outputted from the regulator circuit 4 is supplied through the PMOS transistors 12 and 17 in this order to the memory cell 21. At this time, the source-line control circuit 3 in FIG. 1 applies a "H" voltage to the signal lines P0-P4, P6-P8, and P10-P12, so that all the transistors in the source selection gate 6 except the PMOS transistors 12 and 17 are turned off.

Further in the data writing to the memory cell 21, the bit-line control circuit 2 in FIG. 1 applies a "H" voltage to the signal lines N1-N3 and N6-N9 to turn on the NMOS transistors 15, 18, and 19 shown in FIG. 14. Thereby, a current for writing data to the memory cell 21 flows through the NMOS transistors 15 and 18. At this time, the bit-line control circuit 2 in FIG. 1 applies a "L" voltage to the signal lines N0, N4, N5, and N10-N16, so that all the transistors in the bit selection gate 5 except the NMOS transistors 15, 18, and 19 are turned off.

Here, the reason why the NMOS transistors 19 are turned on in the data writing to the memory cell 21 is as follows. Referring to FIG. 15, in the data writing to the memory cell 21, select transistors 116 in memory cells 23 are turned on as well as the select transistor 116 in the memory cell 21. Further, the current from the memory cell 21 flows also to the memory cells 23 through the signal line b3. This results in an increase in the potentials of the memory cells 23 (more specifically, the drain potentials of the memory transistors 115 or the select transistors 116 in the memory cells 23). To prevent this, in the data writing to the memory cell 21, the NMOS transistors 19 are turned on to draw charge flowing from the memory cell 21 to the memory cells 23.

As shown in FIG. 7, the memory module according to this second preferred embodiment, like that shown in FIG. 2 according to the aforementioned first preferred embodiment, has the plurality of floating gates 103 in a staggered arrangement. Thus, it can achieve the effect of reducing the area of the memory array block 1 without reducing the gate widths of the floating gates 103, like the memory module according to the aforementioned first preferred embodiment.

Besides, since the source and bit lines are interchangeable, the area of the memory array block 1 can be reduced as compared with the case where a plurality of metal interconnect lines serving only as source lines and a plurality of metal interconnect lines serving only as bit lines are separately provided.

Third Preferred Embodiment

Figure 16:
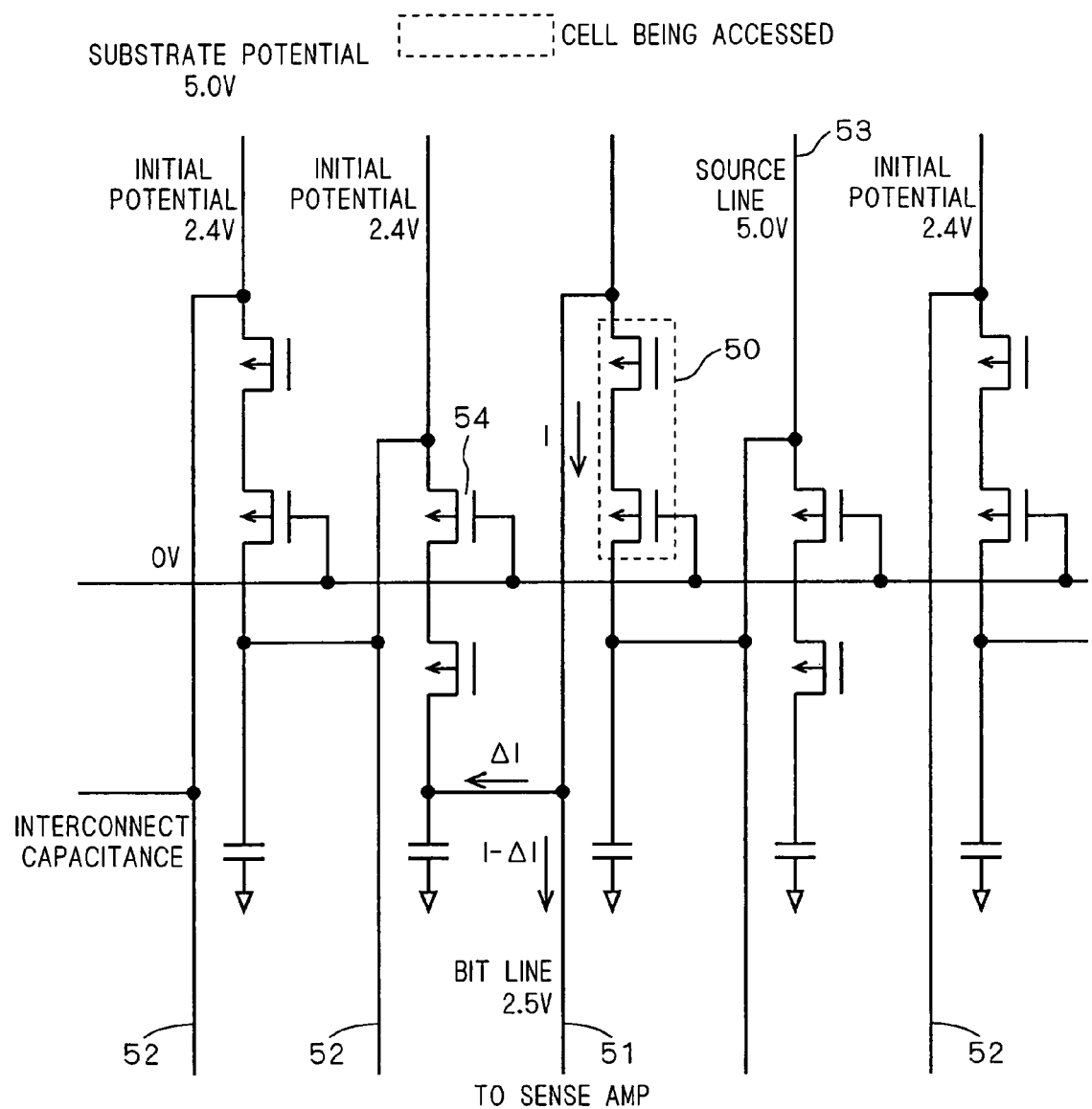
FIGS. 16 and 17 are circuit diagrams showing part of the circuit configuration of a memory array block in a type of memory module which uses interchangeable source and bit lines.
Figure 17:
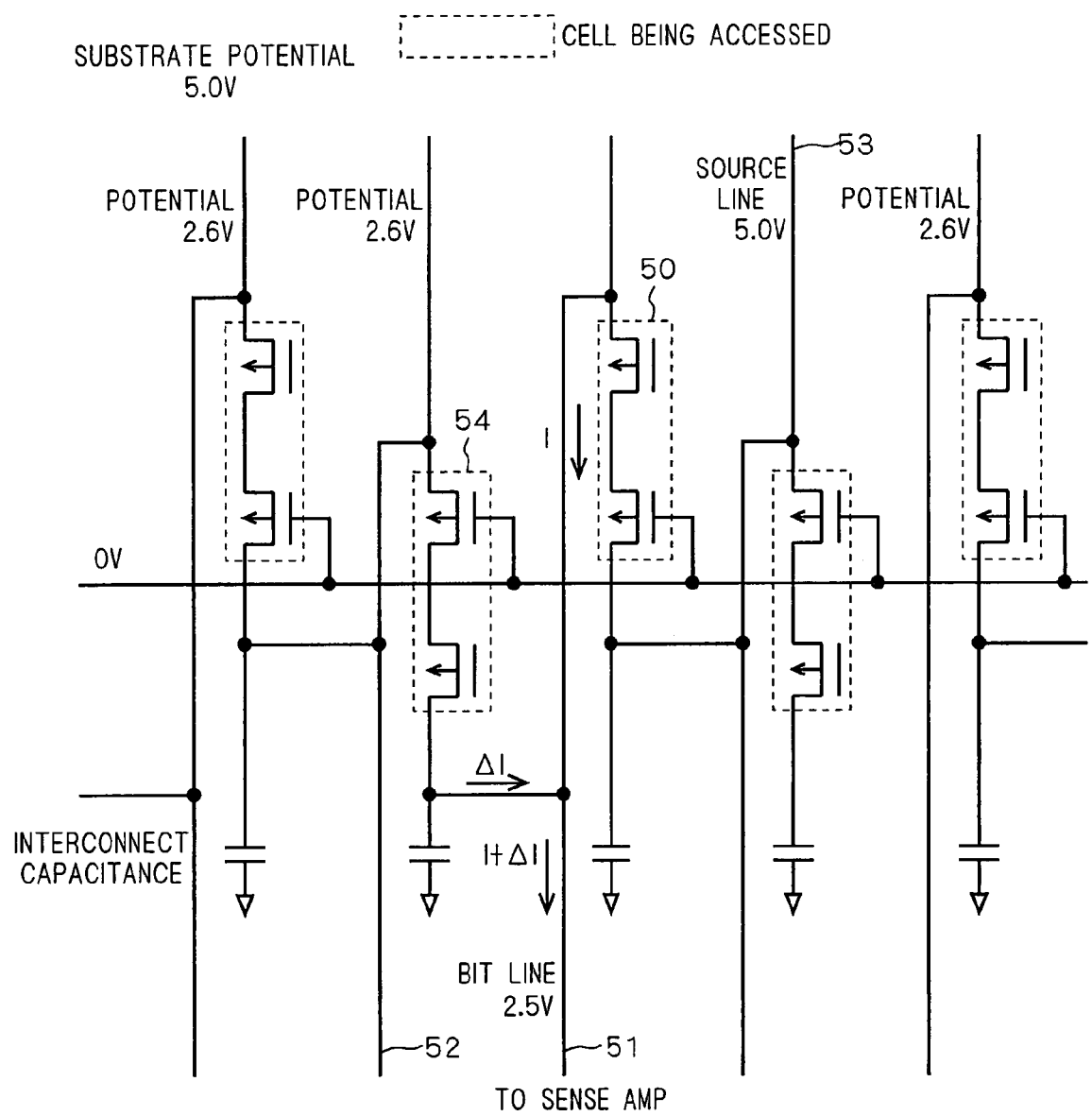

FIGS. 16 and 17 are circuit diagrams showing part of the circuit configuration of the memory array block 1 in a type of memory module which uses interchangeable source and bit lines as in the aforementioned second preferred embodiment or as in the subsequent fourth preferred embodiment. In the example shown in FIG. 16, a memory cell 50 is a selected memory cell to be accessed, in which case a signal line 53 serves as a source line, and a signal line 51 as a bit line. Also in FIG. 16, a memory cell 54 is a non-selected memory cell which is not accessed but whose select transistor 116 is turned on as that of the memory cell 50. Signal lines 52 are signal lines connected to non-selected memory cells.

In the example shown in FIG. 16, a substrate potential (i.e., the potential applied to the silicon substrate 110 shown in FIGS. 10 and 11) is 5.0 V, a voltage supplied from the source line is also 5.0 V, and the initial potential of the signal line 52 is 2.4 V. In this case, when the potential of the bit line (signal line 51) increases to 2.5V resulting from data reading from the memory cell 50, part of current from the memory cell 50 will flow to the signal line 52 having a lower potential than the bit line. As a result, the amount of current flowing to the sense amplifier 8 is reduced, which becomes a cause of misjudgment.

In the example shown in FIG. 17, the substrate potential is 5.0 V, the voltage supplied from the source line is also 5.0 V, the initial potential of the signal line 52 is 2.4V, and the potential of the bit line is 2.5 V. In this case, if the potential of the signal line 52 increases to 2.6 V due to any cause, a current flows from the signal line 52 to the bit line. As a result, a current flowing to the sense amplifier 8 is increased, which becomes a cause of misjudgment. Also, a leakage current of the memory transistor 115 flows to the bit line, which also becomes a cause of misjudgment by the sense amplifier 8.

In view of the foregoing, this third preferred embodiment describes a memory module which can prevent the aforementioned harmful effects.

Figure 18:
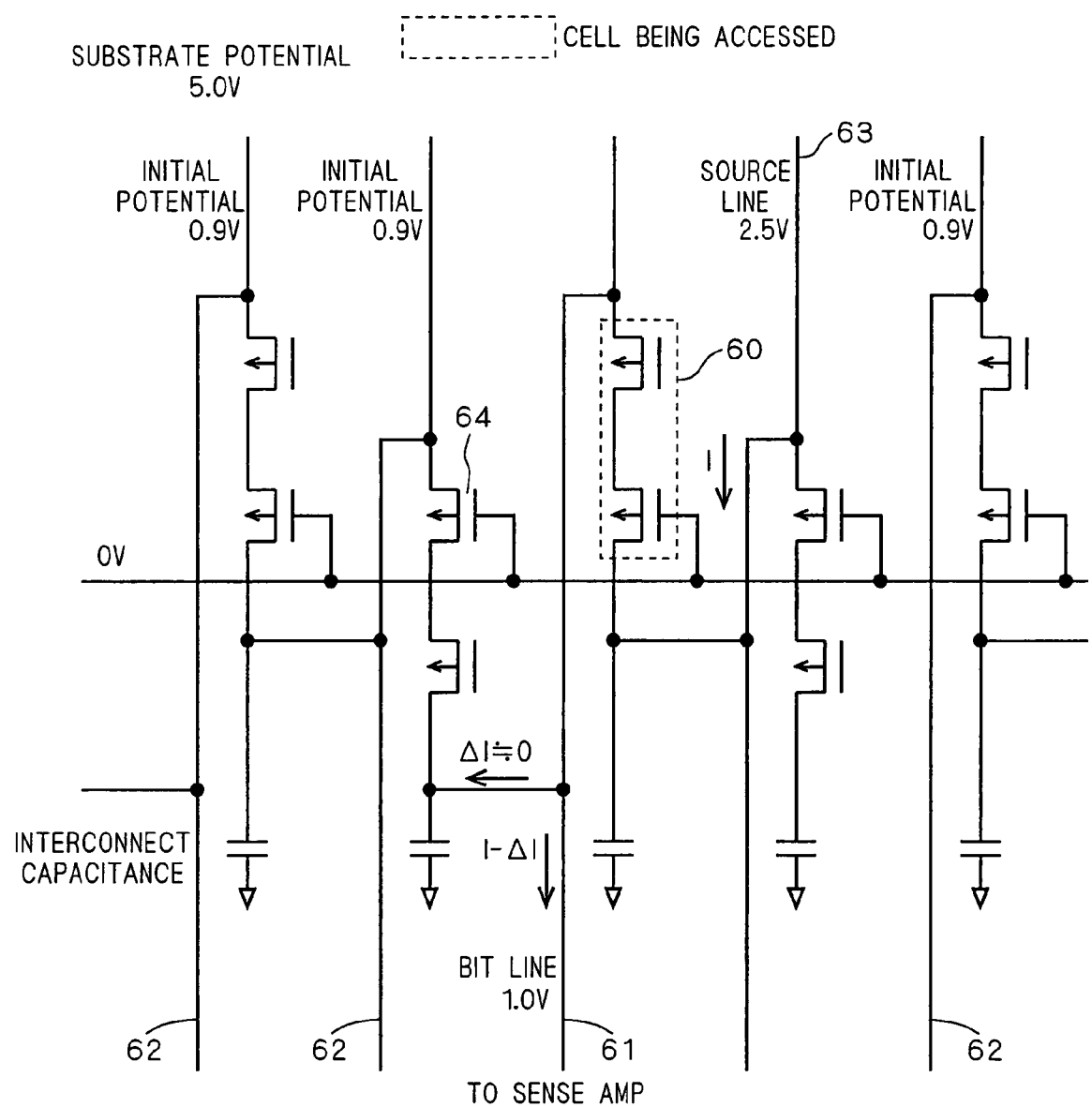
FIGS. 18 and 19 are circuit diagrams showing part of the circuit configuration of a memory array block according to a third preferred embodiment of the present invention.
Figure 19:
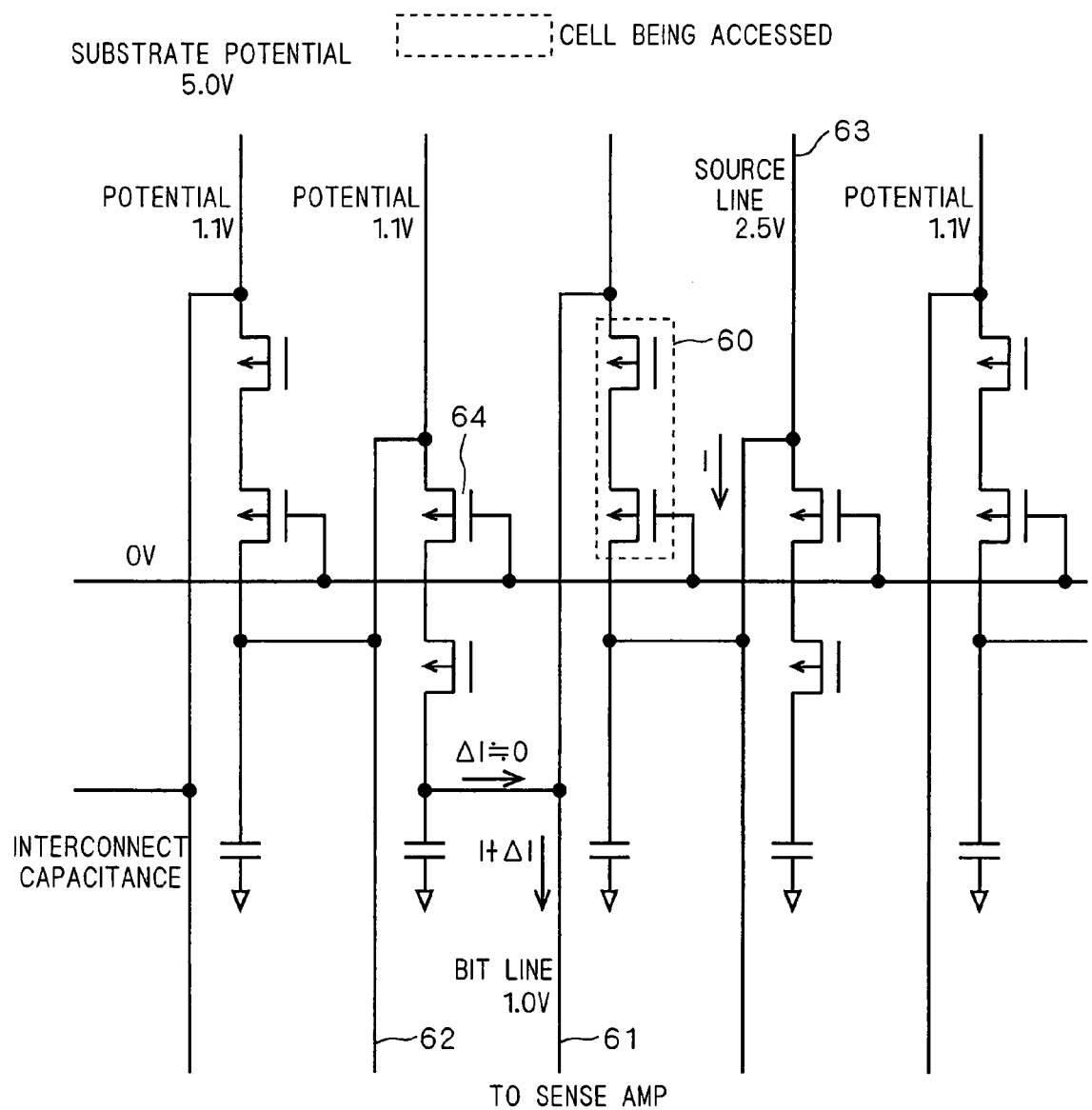

FIGS. 18 and 19 are circuit diagrams showing, in correspondence with FIGS. 16 and 17, part of the circuit configuration of the memory array block 1 according to the third preferred embodiment of the present invention. In the example shown in FIG. 18, a memory cell 60 is a selected memory cell to be accessed, in which case a signal line 63 serves as a source line, and a signal line 61 as a bit line. Also in FIG. 18, a memory cell 64 is a non-selected memory cell which is not accessed but whose select transistor 116 is turned on as that of the memory cell 60. Signal lines 62 are signal lines connected to non-selected memory cells.

In the example shown in FIG. 18, the substrate potential is 5.0 V, and a voltage supplied from the source line (source potential) for access to the memory cell 60 is 2.5 V which is lower than the substrate potential. The initial potential of the signal line 62 is 0.9 V. In this case, even if the potential of the bit line (signal line 61) increases to 1.0 V resulting from data reading from the memory cell 60, little current will flow from the memory cell 60 to the memory cell 64 because of the body effect (substrate bias effect). That is, since the substrate potential is 5.0 V and higher than the source potential of 2.5 V of the select transistor 116, the threshold voltage of the select transistor 116 is increased by the body effect. As a result, a current flowing from the bit line to the signal line 62 becomes nearly equal to zero.

The source potential of 2.5 V is generated by a power supply voltage of 5.0 V in the regulator circuit 4 shown in FIG. 1. The regulator circuit 4 also has the function of controlling a voltage between the source and drain of the memory transistor 115 to be always within 2.4 V, in order to prevent the occurrence of unintended data writing due to excessive current flow to the memory cells.

In the example shown in FIG. 19, the substrate potential is 5.0 V, the source potential is 2.5 V, the initial potential of the signal line 62 is 0.9 V, and the potential of the bit line is 1.0 V. In this case, even if the potential of the signal line 62 increases to 1.1 V due to any cause, little current will flow from the signal line 62 to the bit line because the threshold voltage of the select transistor 116 is increased by the body effect. Besides, a leakage current of the memory transistor 115 is also reduced, since the threshold voltage of the memory transistor 115 is also increased by the body effect.

In this way, in the memory module according to this third preferred embodiment, for access to a selected memory cell, a potential lower than the substrate potential is supplied from the regulator circuit 4 to the selected memory cell. Accordingly, the threshold voltages of both the memory transistor 115 and the select transistor 116 are increased by the body effect. This prevents the increase or decrease in the current flow from the bit line to the sense amplifier 8 caused by interference of non-selected memory cells adjacent to the selected memory cell or by the leakage current of the memory transistor 115. Consequently, misjudgment by the sense amplifier 8 can be avoided.

Fourth Preferred Embodiment

Figure 20:
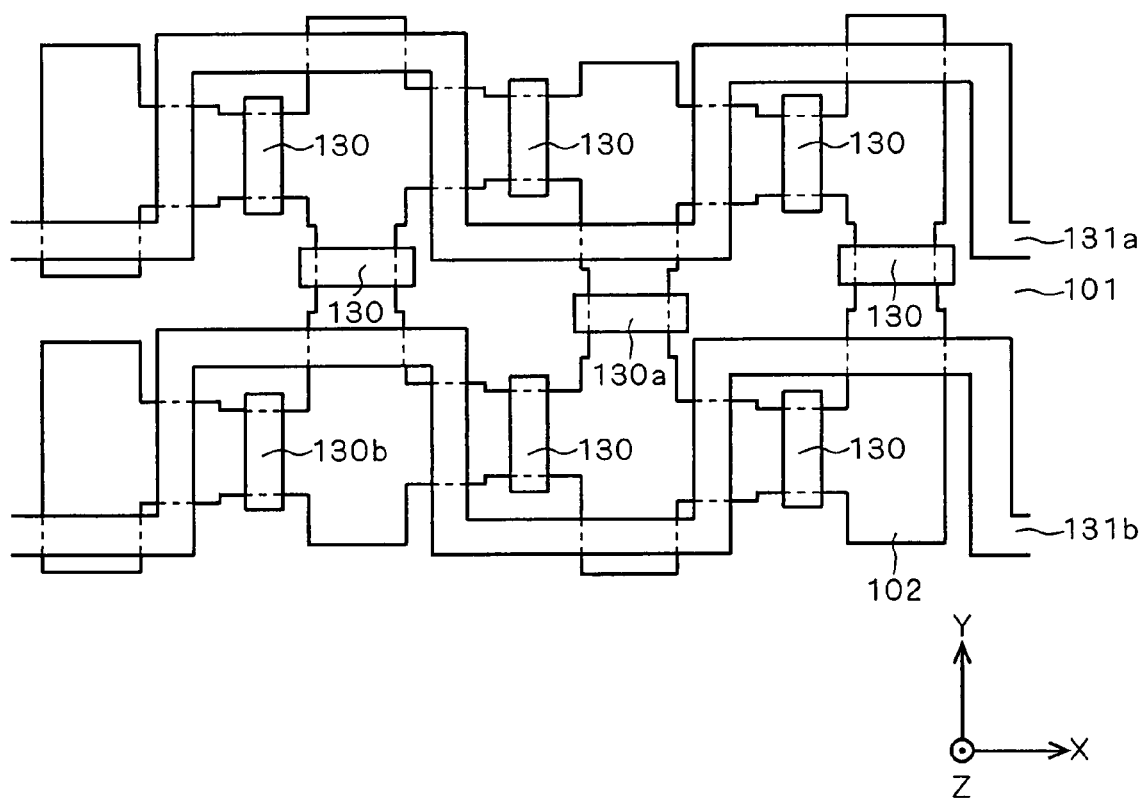
FIGS. 20 and 21 are top views showing, in partial cutaway, a layout pattern of a memory array block according to a fourth preferred embodiment of the present invention.
Figure 21:
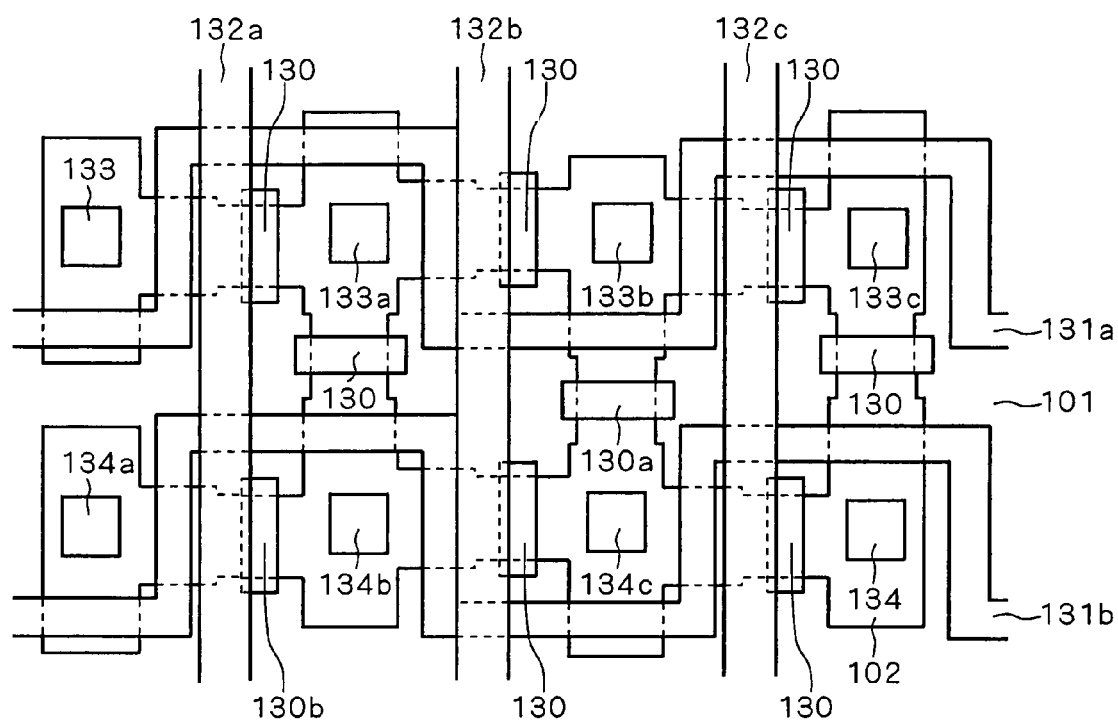
Figure 21:
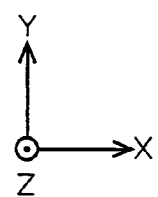

FIGS. 20 and 21 are top views showing, in partial cutaway, a layout pattern of the memory array block 1 according to a fourth preferred embodiment of the present invention. To clearly show the arrangement pattern of floating gates 130, FIG. 20 omits metal interconnect lines 132a, 132b, and 132c in the structure shown in FIG. 21.

Referring to FIG. 20, meandering select gates 131a and 131b and a plurality of floating gates 130 (including 130a and 130b) coupled with the select gates 131a and 131b are arranged. The floating gates 130 include those which are arranged to have their gate widths defined along the X direction (e.g., the floating gate 130a) and those which are arranged to have their gate widths defined along the Y direction (e.g., the floating gate 130b).

Referring to FIG. 21, the plurality of metal interconnect lines 132a to 132c serving as source or bit lines are arranged in columns extending in the Y direction as first-layer interconnection. As an alternative, those metal interconnect lines 132a to 132c may be divided between two interconnect layers and alternately arranged with even-numbered ones as first-layer interconnection and odd-numbered ones as second-layer interconnection. This prevents interference of current between each adjacent memory cells and avoids misjudgment by the sense amplifier 8 without application of the feature of the present invention described in the above third preferred embodiment. The metal interconnect lines 132a to 132c are made of, for example, aluminum.

The metal interconnect lines 132a to 132c are in contact with the upper surface of the impurity diffusion region 102 through contact holes 133 (including 133a, 133b, 133c), contact holes 134 (including 134a, 134b, 134c), and metal interconnect lines not shown. More specifically, the metal interconnect line 132a is connected to the contact holes 133a and 134a, the metal interconnect line 132b to the contact holes 133b and 134b, and the metal interconnect line 132c to the contact holes 133c and 134c.

Referring to FIG. 21, for example when a memory cell including the floating gate 130a and the select gate 131a is being accessed, the metal interconnect line 132b serves as a source line, and the metal interconnect line 132c as a bit line. More specifically, a source potential is supplied from the metal interconnect line 132b through the contact hole 133b to the impurity diffusion region 102 (the source of the select transistor 116), and the output voltage of the memory cell is transmitted from the impurity diffusion region 102 (the drain of the memory transistor 115) through the contact hole 134c to the metal interconnect line 132c.

Conversely, when a memory cell including the floating gate 130b and the select gate 131b is being accessed, the metal interconnect line 132a serves as a source line, and the metal interconnect line 132b as a bit line. More specifically, a source potential is supplied from the metal interconnect line 132a through the contact hole 134a to the impurity diffusion region 102 (the source of the select transistor 116), and the output voltage of the memory cell is transmitted from the impurity diffusion region 102 (the drain of the memory transistor 115) through the contact hole 134b to the metal interconnect line 132b.

In this way, the memory module according to this fourth preferred embodiment has the meandering select gates 131a and 131b and the plurality of floating gates 130 arranged along respective sides of the meandering select gates 131a and 131b. Thus, it can reduce the area of the memory array block 1 without reducing the gate widths of the floating gates 130, as compared to the conventional memory module shown in FIG. 6.

While the invention has been shown and described in detail, the foregoing description is in all aspects illustrative and not restrictive. It is therefore understood that numerous modifications and variations can be devised without departing from the scope of the invention.

What is claimed is:

1. A semiconductor memory comprising:

a select gate formed in a meandering pattern;

a plurality of floating gates coupled with said select gate, said plurality of floating gates including:

a first floating gate arranged to have its gate width defined along a first direction; and a second floating gate arranged to be adjacent to said first floating gate and to have its gate width defined along a second direction perpendicular to said first direction, a plurality of memory cells sharing said select gate and each having one of said plurality of floating gates, said plurality of memory cells including first and second memory cells;

a plurality of transistors connected respectively to outputs of said plurality of memory cells, said plurality of transistors including first and second transistors; and a control circuit for controlling said plurality of transistors, wherein, in writing data to said first memory cell, said control circuit turns on, out of said plurality of transistors, said first transistor connected to said first memory cell and said second transistor connected to said second memory cell to which current flows from said first memory cell.

* * * * *